(12) United States Patent
Pfenningstorf et al.

(10) Patent No.: US 8,853,859 B2
(45) Date of Patent: Oct. 7, 2014

(54) PASSIVATION FOR WAFER LEVEL—CHIP-SCALE PACKAGE DEVICES

(75) Inventors: Olaf Pfenningstorf, Hamburg (DE); Wolfgang Schnitt, Hamburg (DE)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 13/464,583

(22) Filed: May 4, 2012

(65) Prior Publication Data
US 2013/0292837 A1    Nov. 7, 2013

(51) Int. Cl.
| H01L 23/48 | (2006.01) |
| H01L 21/56 | (2006.01) |
| H01L 23/485 | (2006.01) |
| H01L 23/31 | (2006.01) |
| H01L 21/50 | (2006.01) |

(52) U.S. Cl.
CPC ............... *H01L 21/50* (2013.01); *H01L 21/56* (2013.01); *H01L 23/485* (2013.01); *H01L 23/3185* (2013.01); *H01L 2924/0002* (2013.01); *H01L 23/31* (2013.01)
USPC ........................................................ 257/773

(58) Field of Classification Search
CPC ......... H01L 21/50; H01L 21/56; H01L 23/31; H01L 23/485
USPC .......... 438/113, 114, 458, 460; 257/668, 737, 257/773, E23.068
See application file for complete search history.

(56) References Cited

U.S. PATENT DOCUMENTS

| 6,008,118 A * | 12/1999 | Yeh et al. ....................... 438/629 |
| 2004/0023438 A1* | 2/2004 | Egawa et al. .................. 438/113 |
| 2005/0167799 A1* | 8/2005 | Doan ............................. 257/678 |

OTHER PUBLICATIONS

Henri Jansen, et al., "A survey on the reactive ion etching of silicon in microtechnology", RIE of Si in microtechnology, IOP Publishing Ltd, 1996.

* cited by examiner

*Primary Examiner* — Brook Kebede

(57) ABSTRACT

Aspects of the disclosure are directed towards an efficient wafer level chip-scale package, and methods or producing the packages. Various aspects are directed to protecting against humidity, contamination, mechanical damage, and current leakage while maintaining isolation and manufacturability of the plastic package and a ratio of active die size to package size.

19 Claims, 6 Drawing Sheets

PASSIVATION FOR WAFER LEVEL—CHIP-SCALE PACKAGE DEVICES

Plastic packages are used in the surface mount electronics market. These packages offer features such as electrical isolation, protection of the silicon chip against damage due to handling, humidity isolation, and can have good solderability.

While plastic packages can be useful for a variety of applications, their implementation can be challenging as the portion of the package that can be used for an electrical circuit can be limited. For instance, a silicon die packaged in a plastic package often has to be much smaller than the package body, lead frame and wire loop need a great deal of space within the package.

These and other issues have presented challenges to the design, construction and implementation of waver level chip-scale packages.

Various example embodiments are directed to chip-scale packages, their manufacture and their implementation, as may be applicable to addressing one or more challenges such as those discussed above.

Certain example embodiments of the instant disclosure are directed towards apparatuses that contain a self-contained chip-scale device package and a printed circuit board (PCB). The PCB included in the apparatuses, consistent with the instant disclosure, includes one or more conductive contacts at a surface of the PCB, for coupling to the chip-scale device package. The chip-scale device package is connected to the PCB, and includes a silicon wafer, with an active side including an integrated circuit, a non-active side, having bulk silicon, and sidewalls extending therebetween. Additionally, the chip-scale device package includes one or more conductive contacts at a surface of the active side, and an interconnect structure that connects the conductive contact(s) to the integrated circuit. The chip-scale device package also includes an electrically isolating coating, such as a plasma coating, that continuously extends along, and is in contact with, one of sidewalls and the non-active side. The coating mitigates current leakage between the sidewalls and the first conductive contact (e.g., via sidewalls).

Certain aspects of the instant disclosure are additionally directed towards methods including connecting a silicon wafer to a foil, and dicing the silicon wafer to produce a plurality of self-contained chip-scale device packages. Each device package is separated from other device packages by a gap defined by sidewalls of the device packages. Further, each device package is connected to the foil, and has an active side and a non-active side between which the sidewalls extend. Additionally, an electrically isolating coating is deposited on the sidewalls and on at least a portion of the non-active side of each of the plurality of device packages.

Additional aspects of the instant disclosure are methods that involve a wafer having an active side, including a plurality of independently-operable integrated circuits, and a non-active side. Each of the plurality of independently-operable integrated circuits is separated from one another by separation regions within the wafer. The wafer can be connected to a sawing foil, and diced at the separation regions. Dicing at the separation regions produces a plurality of self-contained chip-scale device packages and having sidewalls defined by the dicing. The self-contained chip-scale device packages remain connected to the sawing foil, and each device package includes one of the plurality of integrated circuits. Further, each device package is separated from other ones of the device packages by a gap defined by the sidewalls of the packages. Additionally, an electrically isolating coating can be on the sidewalls and the non-active side of each of the device packages. Subsequently, the device packages can be separated from the sawing foil and attached to a printed circuit board (PCB) via a solder bump or adequate connections.

The above discussion is not intended to describe each embodiment or every implementation. The figures and following description also exemplify various embodiments.

Various example embodiments may be more completely understood in consideration of the following detailed description in connection with the accompanying drawings, in which:

FIGS. 1A and 1B shows a wafer at different stages of manufacture, in accordance with aspects of the instant disclosure in which FIG. 1A shows a wafer, prior to dicing, and FIG. 1B shows the wafer of FIG. 1A after the wafer has been diced to form a plurality of chip-scale device packages having an insulative layer on sidewalls therebetween, in accordance with aspects of the instant disclosure;

Figure 1A:
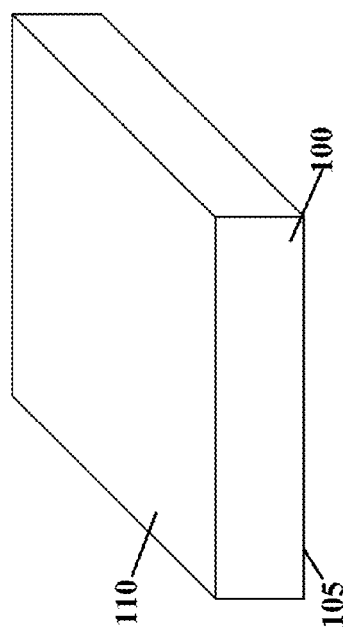

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

Aspects of the present invention are believed to be applicable to a variety of different types of devices, systems and arrangements involving chip-scale packages, and isolation formed thereupon. While the present invention is not necessarily so limited, various aspects of the invention may be appreciated through a discussion of examples using this context.

Various embodiments of the instant disclosure are directed towards methods that include connecting a silicon wafer to a sawing foil, dicing the silicon wafer and forming a plurality of self-contained chip-scale packages therefrom (e.g., tens of thousands of self-contained chip-scale device packages can be formed from a single wafer). Each device package is separated from the other device packages by a gap defined by sidewalls of the device packages, as formed via the dicing process. In addition, each device package includes an active side and a non- active side, with the sidewalls extending therebetween. An electrically isolating coating is deposited on the sidewalls, and facilitates electrical isolation and protection of the wafer material. The electrically isolating coating is deposited after sawing/separation while the plurality of self-contained packages is still attached to the sawing foil, for all packages at once.

In some embodiments, the electrically isolating coating is a plasma coating that can be applied with relatively little space between the respective devices. In connection with these embodiments, it has been discovered that by applying a plasma coating, the gap separating the respective packages (as defined by the sidewalls) can be very small. In some implementations, the wafer is also diced using a plasma cutting process, which may be used to deposit the electrically isolating coating concurrently with and/or after the cutting process. It has further been discovered that this approach facilitates the dicing of the devices with very small gaps, via which such a plasma coating can be applied to the sidewalls therein. It has further been discovered that when a plasma dicing cutting process is used chip-scale packages with non-rectangular shapes can be produced, such as with rounded edges, angled sides (e.g., acute relative to one of the active and non-active surfaces) and others. In addition, with these approaches process steps such as die bonding, wire bonding and molding can be avoided (e.g., with the "molding" is done during sawing (plasma dicing)).

The packages as described herein, and related methods, can be implemented in a variety of manners. In certain embodiments of the instant disclosure, the sidewalls create an angle between the non-active side and the active side. Further, dicing the silicon wafer, in other embodiments, creates chip-scale device packages having rounded edges such that the corners of the active and non-active sides are rounded. Additionally, certain methods of the instant disclosure include depositing an electrically isolating coating including $Si_xO_yF_z$ on the sidewalls and on at least a portion of the non-active side of each of the plurality of device packages.

In accordance with various embodiments of instant disclosure, an etch mask is utilized to etch a portion of the non-active side of the device packages under the mask. In these embodiments, an electrically isolating coating is deposited on the sidewalls and the etched portion of the non-active side of the device packages. The etch mask is removed after dicing the silicon wafer, and prior to depositing an electrically isolating coating on a portion of the side walls of the device packages. In some implementations, the electrically isolating coating is deposited on the entire non-active side of the device packages.

In some embodiments, dicing of the silicon wafer produces device packages that are separated from other device packages by a distance less than 20 μm, and the electrically isolating coating is deposited at a thickness of less than 1 μm. Additionally, in certain embodiments pads (e.g., including Ni; Pd; or Au) are formed on the active side of the package at a first pitch, and subsequently, the device packages are connected to the printed circuit board using printed circuit board connectors having a pitch different than the first pitch. In such instances, the electrically isolating coating is used to mitigate current leakage between at least one of the sidewalls and one of the PCB connectors.

Certain aspects of the instant disclosure are also directed towards methods for processing a wafer having an active side and a non-active side. The active side of the wafer includes a plurality of independently-operable integrated circuits. In this context, independently-operable circuits refer to circuits that operate separately from one another (e.g., can be implemented independently from one another, without connectivity to one another, such as in separate devices). Certain embodiments of the instant disclosure have different sizes and shapes of the plurality of independently-operable integrated circuits. Each of the independently-operable integrated circuits is separated by separation regions within the wafer. In this context, independently-operable refers to operability of the respective circuits, relative to other ones of the circuits in a different device package (e.g., each device package can be independently operated from other device packages).

The wafer, having the independently-operable integrated circuits, is connected to a sawing foil and subsequently diced (e.g., plasma dicing, mechanical sawing) at the separation regions, which separates the independently-operable integrated circuits. As a result of the dicing, a plurality of self-contained chip-scale device packages that have sidewalls defined by the dicing and one of the respective independently-operable integrated circuits remain connected to the sawing foil. In embodiments where the plurality of independently-operable integrated circuits are of different sizes and shapes, the resulting plurality of self-contained chip-scale device packages also have different geometries and sizes. In other embodiments, plasma dicing is used to form sidewalls that are angled or chamfered (e.g., an angle from the active side to the non-active side). Each device package is separated from the other device packages by a gap defined by the sidewalls. Further, some embodiments of methods of the instant disclosure include depositing of an electrically isolating coating (e.g., at thickness between approximately 0.1 μm and 1.0 μm) on the sidewalls and the non-active side of each of the plurality of device packages. Other embodiments include dicing the wafer and depositing the electrically insulating coating in the same processing step as discussed above (e.g., the plasma used to dice the wafer also is deposited as a coating), or in separate processing steps. Subsequently, the device packages can be separated from the sawing foil, and each of the (separated) device packages can be attached to a printed circuit board (PCB) via a solder bump (or other adequate electrical connector).

The device packages are attached to PCBs in one or more of a variety of manners, in accordance with various embodiments. In certain instances, the device packages are attached to the PCB using stencil mask for placing solder paste on the PCB. Certain embodiments utilize a tape and reel packaging process to attach the device packages. Other methods of the instant disclosure form pads on the printed circuit board (PCB) at a first pitch and connect the device packages to PCB connectors having a second pitch (that is different than the first pitch), using the electrically isolating coating to mitigate undesirable electrical connection between the PCB connectors and the surface of the device as may result from the pitch offset. This approach can be used, for example, to mitigate leakage between at least one of the sidewalls and one of the PCB connectors.

Aspects of the instant disclosure are also directed towards apparatuses, which include a printed circuit board (PCB) and a chip-scale device package. The printed circuit board has a first conductive contact at the surface of the PCB. The chip-scale device package, which is connected to the PCB, includes a silicon wafer. The silicon wafer has an active side that includes an integrated circuit, a non-active side having bulk silicon, and sidewalls that extend between the active and non-active sides. Additionally, other embodiments are directed to such a chip-scale device package include a second conductive contact at a surface of the active side. In some embodiments, the apparatus includes an interconnect structure of the chip-scale device package to connect the first conductive contact to the integrated circuit. Further, the second conductive contact, which is connected to the first conductive contact, electrically connects the integrated circuit to the PCB via the first conductive contact and the interconnect structure. The chip-scale device package also includes an electrically isolating plasma coating (e.g., $Si_xO_yF_z$) that extends continuously along, and remains in contact with, at least one of sidewalls and the non-active side. The plasma coating is configured to mitigate current leakage between the sidewalls and the first conductive contact.

In the context of various example embodiments such as those discussed above, chip-scale packages (CSP) such as wafer level chip-scale packages (WLCSP) are manufactured to facilitate a small package size in which nearly all of the device size can be used for the electrical circuit. These packages are often called "chip-scale packages" because the package size is identical or similar to the chip size (the package has an area no greater than 1.2 times that of the die). For some of these packages, the tin for soldering these devices on PCBs is already included in the WLCSP.

Various embodiments are also directed to challenges, including those discussed above, relating to WLCSP and their susceptible to humidity, contamination and mechanical damage. For instance, in accordance with one or more aspects of the disclosure, an electrically isolating coating is provided on the backside and sidewalls of the packages, which has been surprisingly recognized to protect such a chip-scale package against humidity, contamination, mechanical damage, and current leakage, while maintaining isolation and manufacturability of the plastic package and a ratio of active die size to package size of nearly 100%. This approach can address sidewall issues such as those relating to soldering residue (e.g., on bare silicon), which can deteriorate the electrical performance of the silicon device. It has also been discovered/recognized as surprising that a wafer can be diced to form a plurality of chip-scale packages and provide those chip-scale packages with an electrically isolating coating with the same plasma. It has further been discovered/recognized as surprising that a wafer cam be diced to form a plurality of chip scale packages that are not rectangular, especially that have chamfered or rounded edges, and that have an electrically isolating coating.

Figure 1B:
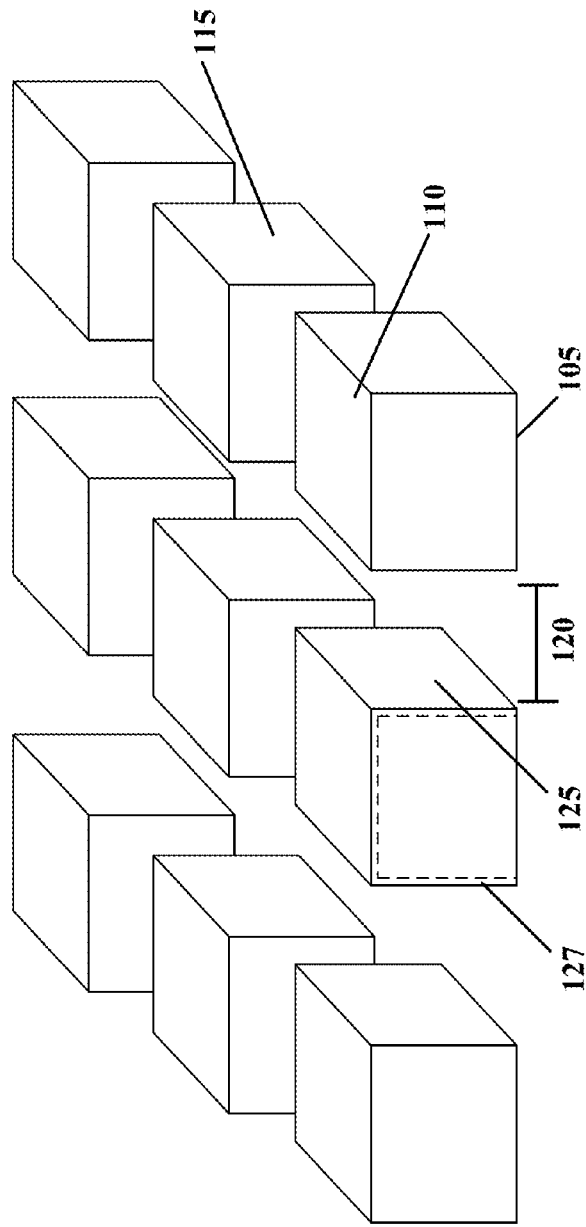

Turning now to the figures, FIG. 1A and FIG. 1B respectively show a bulk silicon wafer 100 before and after dicing, in accordance with various embodiments of the instant disclosure, in an undiced form. The bulk silicon wafer 100 includes an active side 105 and a non-active side 110. The active side 105 includes a plurality of independently-operable integrated circuits.

In FIG. 1B, the silicon wafer 100 has been diced (e.g., by plasma dicing, mechanical sawing) thereby forming a plurality of self-contained chip-scale packages, each of which includes an independently-operable integrated circuit, and with package 115 noted by way of example. The device packages are separated from one another by a gap 120, which is defined by sidewalls 125 of the device packages. Each of the plurality of self-contained chip-scale packages shown in FIG. 1B has an active side 105 and a non-active side 110, which the sidewalls 125 extend between. In addition, an insulative coating has been formed on the sidewalls and non-active side 110, as shown by way of example with dashed lines at 127 (while all four sidewalls can be coated with such an isolation layer, for illustration, two sidewalls are represented by the dashed lines).

While the self-contained chip-scale packages shown in FIG. 1B have similar geometries, certain embodiments are directed to such chip-scale packages having different geometries. In addition, while a few self-contained chip-scale packages are shown, various embodiments are directed to forming thousands, or tens of thousands (e.g., 140,000) self-contained chip-scale packages such as package 115.

In certain instances, the bulk silicon wafer 100, in an undiced form, includes solderable pads located on the active side 105. Additionally, although FIGS. 1A and 1B display that the active side 105 is facing downwards (i.e., towards a sawing foil), in certain instances the active side 105 is diced while facing upwards, and subsequently transferred to a different sawing foil prior to formation of the insulating layer 127. In some implementations, this approach involving a downward-facing active side includes additional manufacturing steps, as described in further detail below, used to complete a manufacturing process (e.g., tape and reel) with the active side 105 being placed on a printed circuit board (PCB). Tape and reel, for example, involves placing the device packages with every die being placed into a separate pocket or space. This can be carried out with soldered bumps on the device package facing downwards. Aspects of the instant disclosure insure correct placement of the device package prior to completing a manufacturing process (e.g., possible transferring of packages to a second sawing foil). Pick and place equipment on the PCB assembly line can pick the packages out of the pockets and place them directly onto the PCB.

Figure 2:
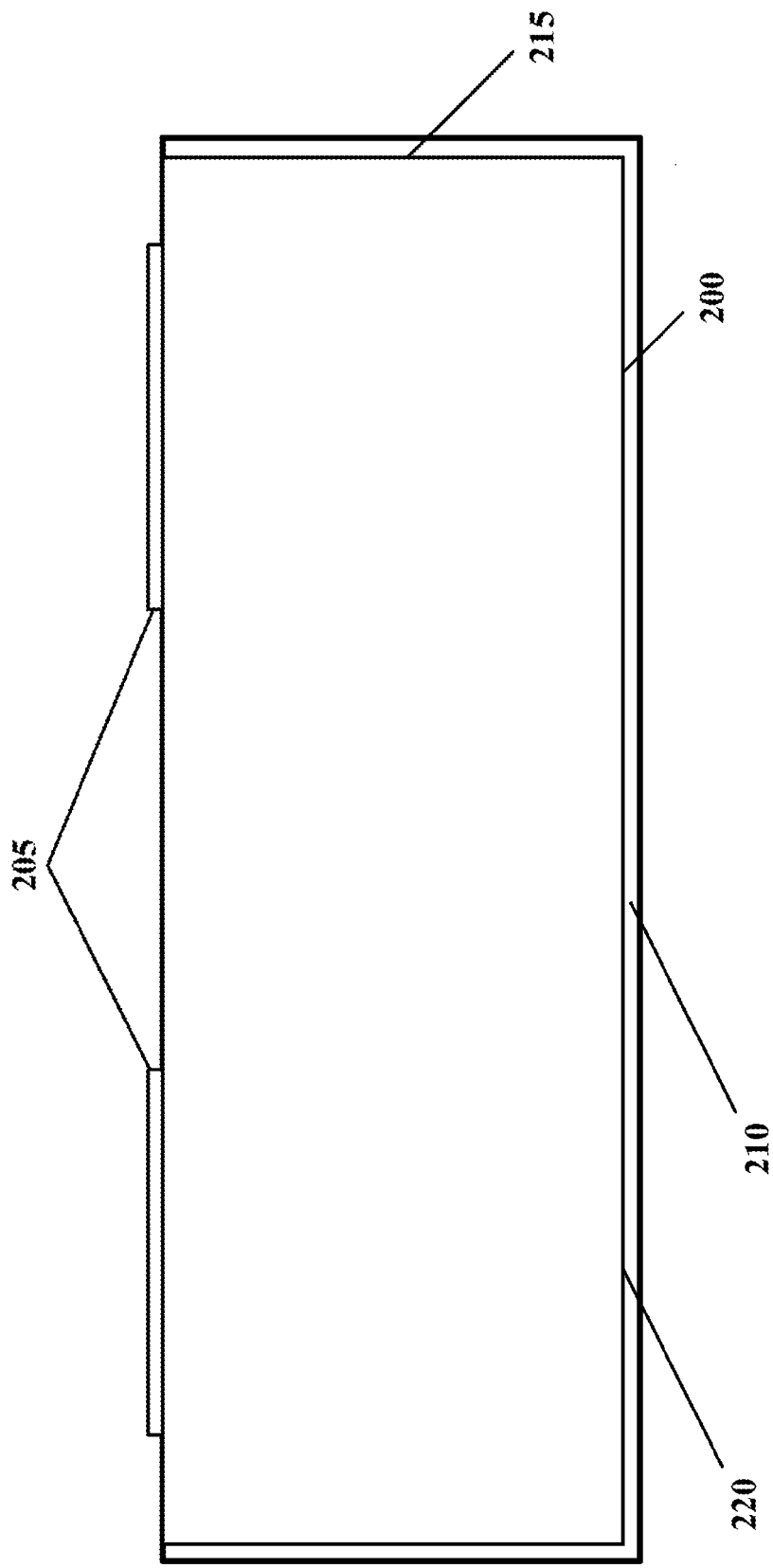
FIG. 2 shows an example embodiment of a chip-scale package, in accordance with aspects of the instant disclosure, and including an electrically isolating layer.

FIG. 2 shows a self-contained chip-scale package 200 that includes an electrically isolating coating 210 (e.g., $Si_xO_yF_z$) which is deposited on the sidewalls 215 and on at least a portion of the non-active side 220 of the device package. The package 200 may, for example, be implemented in accordance with the approaches shown in and described in connection with FIGS. 1A and 1B (e.g., as package 115). In some implementations, the electrically isolating coating is deposited at a thickness between approximately 0.1 μm and 1.0 μm). As many of the device packages are contained on a sawing foil, each of the plurality of device packages sidewalls 215 and on at least a portion of the non-active side 220 are deposited with the electrically isolating coating 210. The active side 205 is also shown having pads in FIG. 2.

Although FIG. 2 shows the single self-contained chip-scale packages having sidewalls 215 that are perpendicular to the non-active side 220, the sidewalls 215 can be diced in a way that the sidewalls 215 are sloped or angled from the non-active side 220 to the active side 205, or from the active side 205 to the non-active side 220. Further, the sidewalls 215 can be diced such that the corners are notched (as shown in further detail in FIG. 3). The self-contained chip-scale package 200 can be diced such that the edges formed by the sidewalls are rounded (as shown in further detail in FIG. 6). For instance, plasma dicing is used in some embodiments to angle the edges formed by the active side and the sidewalls and/or by the non-active side and the sidewalls. This can be accomplished, for example, by changing the plasma conditions during the dicing process. In another instance, edges formed between sidewalls and the non-active and active sides are rounded, angles or chamfered using an etching mask. In various embodiments, such shapes are facilitated by the ability to deposit an electrically insulating coating of relatively small thickness (e.g., via plasma deposition) on opposing sidewalls of different packages separated by small distances (e.g., less than 20 μm).

Figure 3:
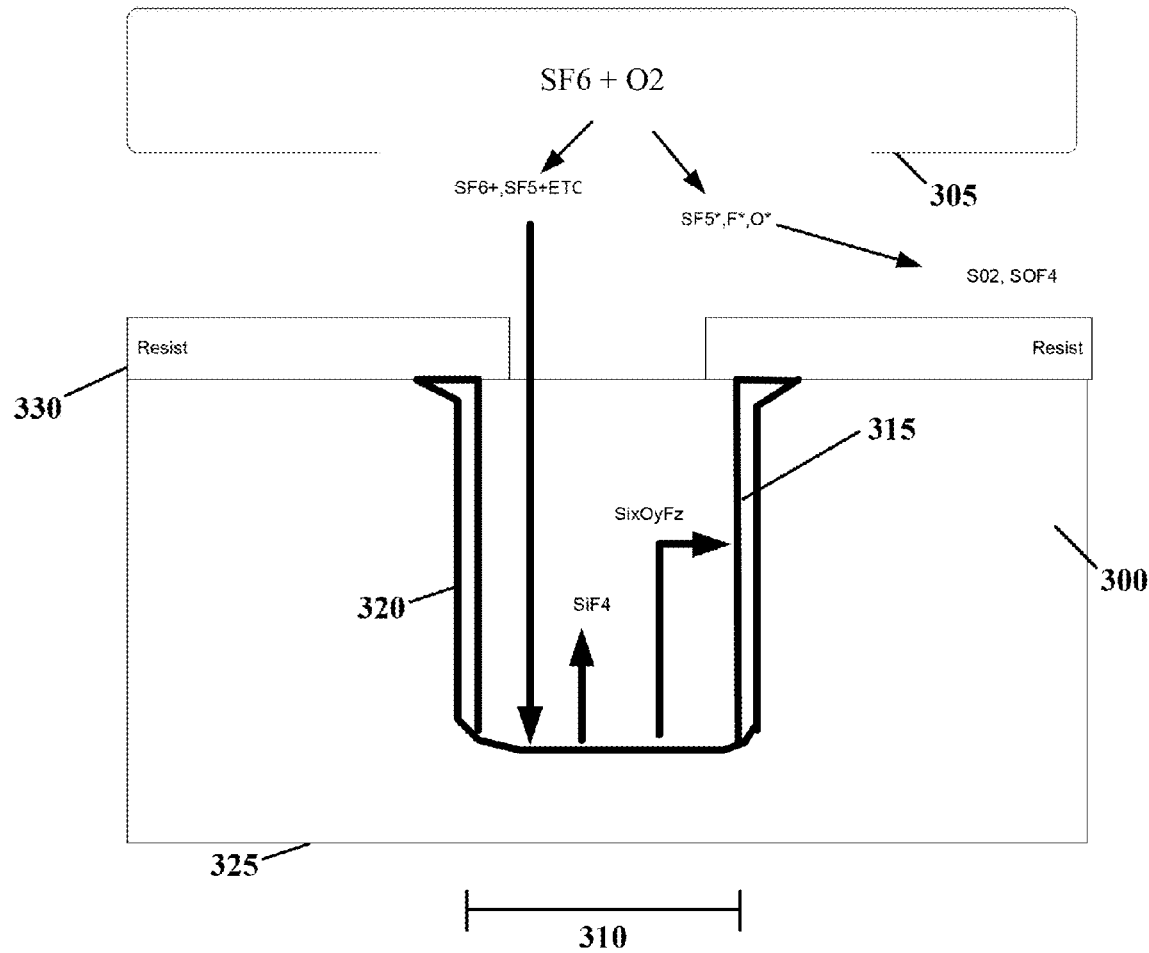
FIG. 3 shows an example deposition and/or dicing process of a chip-scale package, in accordance with aspects of the instant disclosure.

FIG. 3 shows an example deposition and dicing process, in accordance with embodiments of the instant disclosure. In certain embodiments of the instant disclosure, dicing of the silicon wafer 300 can include using a plasma 305 to remove portions of the silicon wafer in the gaps 310, and depositing an electrically isolating coating 315 on the sidewalls 320 and the non-active sides 325 includes depositing the coating from a plasma. Additionally, as shown in FIG. 3, an etch mask 330 can be provided, and used to etch a portion of the non-active side 325 of the device packages under the mask 330. When a etch mask is used, the deposition of the electrically isolating coating 315 includes depositing the electrically isolating coating 315 on the sidewalls 320 and the etched portion of the non-active side 325 of the device packages.

Figure 4:
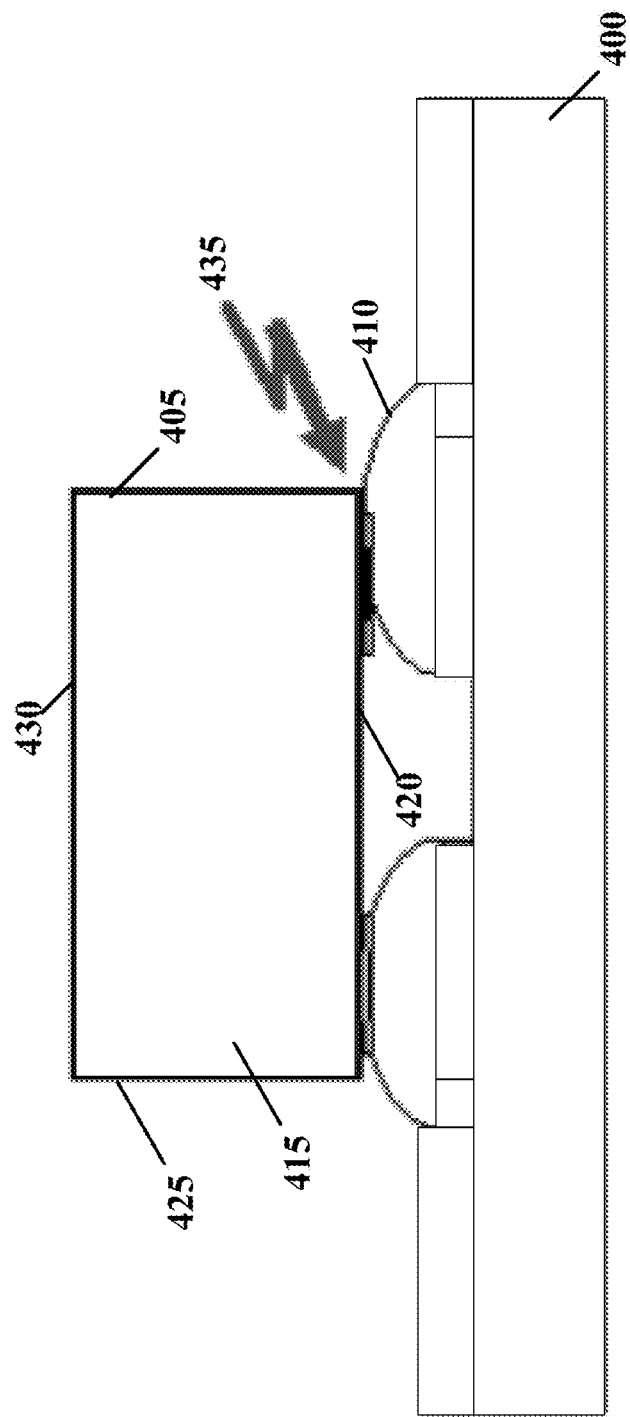
FIG. 4 shows an example chip-scale package and printed circuit board (PCB) arrangement, in accordance with aspects of the instant disclosure.

Turning now to FIG. 4, which shows a printed circuit board (PCB) 400 and a chip-scale device package 405. The PCB 400 has a first conductive contact 410 at a surface of the PCB 400. The chip-scale device package 405 (which is connected to the PCB 400) includes a silicon wafer with an active side 420 that has an integrated circuit. Additionally, the device package 405 includes a non-active side 430 having bulk silicon, and sidewalls 425 that extend between the active side 420 and the non-active side 430. At the surface of the active side 420, there is also a second conductive contact. An interconnect structure connects the first conductive contact 410 to the integrated circuit, and the second conductive contact is connected to the first conductive contact and configured and arranged to electrically connect the integrated circuit to the PCB 400 via the first conductive contact 410 and the interconnect structure. Further, an electrically isolating plasma coating 415 extends continuously along and is in contact with at least one of sidewalls 425 and the non-active side 430. The plasma coating 415 mitigates current leakage 435 between the sidewalls 425 and the first conductive contact 410.

Figure 5:
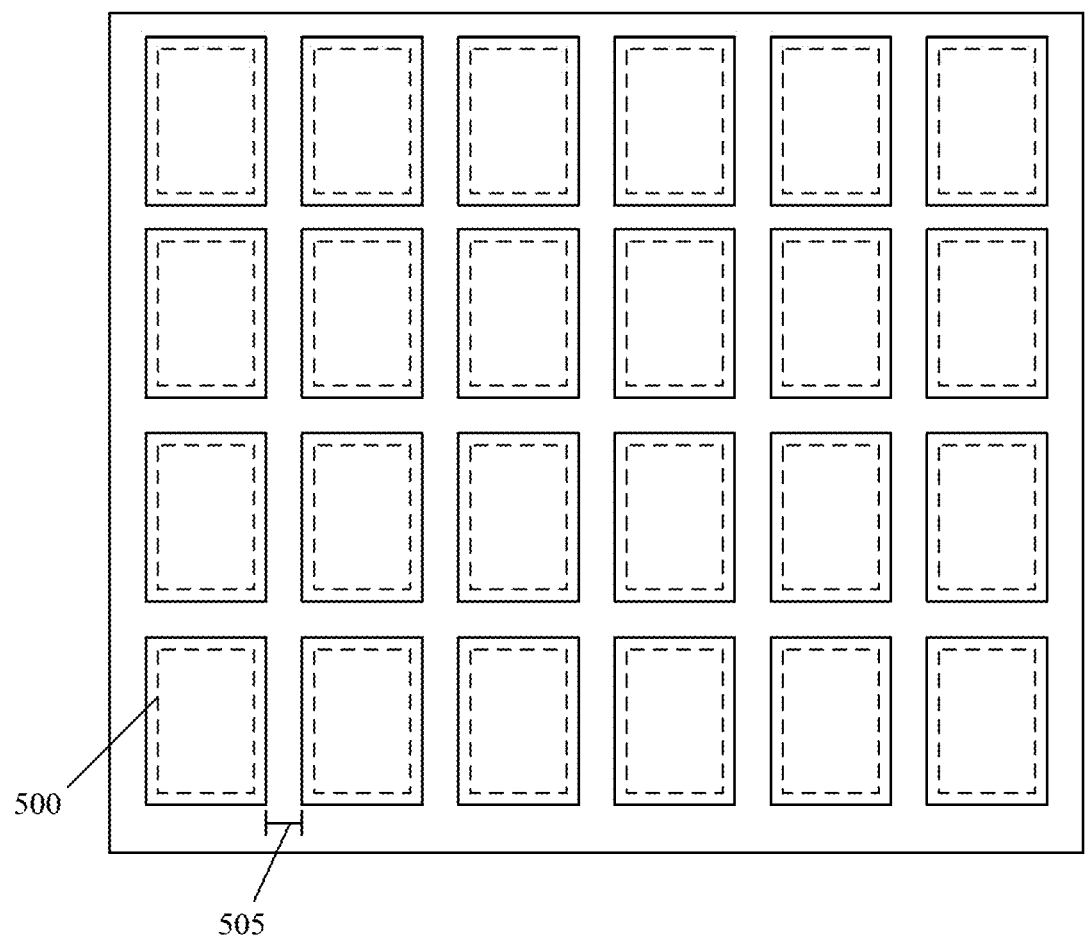
FIG. 5 shows a plurality of chip-scale device packages on a sawing foil, in accordance with aspects of the instant disclosure.

Turning to FIG. 5, device packages, including package 500 labeled by way of example, are shown connected to a sawing foil 505. In certain embodiments, dicing of the silicon wafer 500 produces device packages that are separated from other device packages by a distance 505 less than 20 µm. In various implementations, the device packages 500 are provided with an electrically isolating coating on the backside and sidewalls of the packages resulting, in a recognition of a chip-scale package 500 that is protected against humidity, contamination, mechanical damage, and current leakage, such as described in connection with one or more example embodiments herein.

Figure 6:
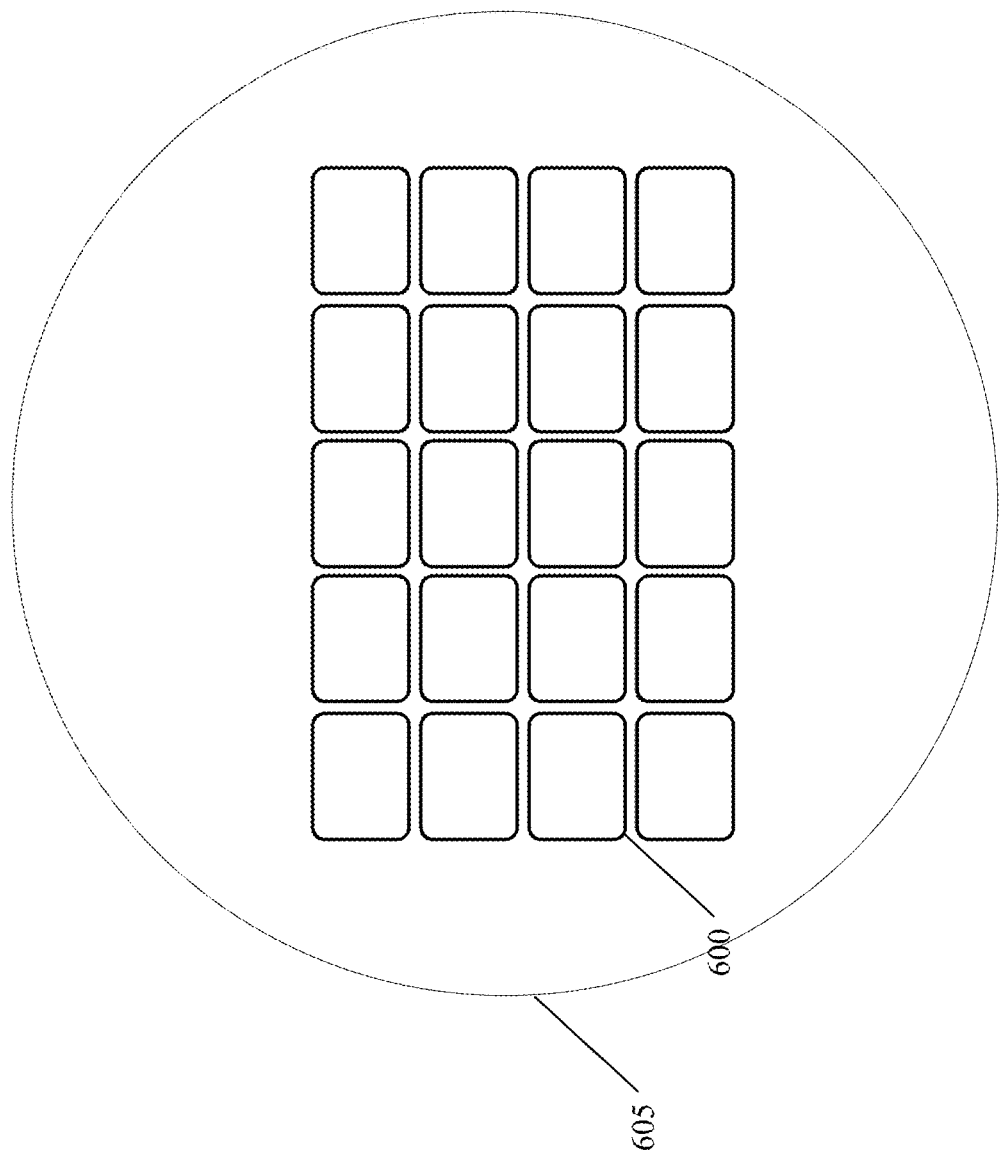
FIG. 6 shows an example embodiment in accordance with aspects of the instant disclosure, including a plurality of chip-scale device packages having rounded corners and mounted on a sawing foil.

FIG. 6 shows an example configuration of a plurality of chip-scale device packages, in accordance with aspects of the instant disclosure. Referring to device package 600 by way of example, the package has rounded corners, and is mounted on a sawing foil 605. As discussed herein, thousands or tens of thousands of such packages may be attached as shown. In some embodiments, each of the chip-scale device packages 600 is attached to a printed circuit board (PCB) using an approach such as that shown in and described in connection with FIG. 4. The chip-scale device packages 600 each include a silicon wafer, with an active side including an integrated circuit, a non-active side, having bulk silicon, and sidewalls extending therebetween. Further, chip-scale device package 600 includes one or more conductive contact(s) at a surface of the active side, and an interconnect structure that connects a conductive contact of the PCB to the integrated circuit, to electrically connect the integrated circuit to the PCB via the conductive contacts and the interconnect structure. Each of the chip-scale device packages includes an electrically isolating plasma coating that continuously extends along, and is in contact with, the sidewalls and the non-active side. The plasma coating mitigates current leakage between the side walls and the first conductive contact.

Use of a silicon wafer (which can have solderable pads on) can be mounted on the sawing foil with the active components on the foil or facing away from the foil (e.g., exposed). If the wafer has been diced/sawed with the active side of the devices up and the non-active side next to the sawing foil, then a wafer transfer is performed. That is, transferring the diced/sawed packages to another sawing foil is carried out such that the arrangement of the crystals is not changed but the active side is now connected to the new sawing foil, thereby exposing the side walls and the backside of the crystals.

The packages as described herein can be implemented using one or more of a variety of sizes. In some embodiments, the thickness of the layer on the sidewalls and on the backside is approximately 0.1 µm to 1.0 µm. The size of the products manufactured in the package ranges from 200 µm×400 µm×200 µm (width×length×height) to 500 µm×1000 µm×400 µm.

Based upon the above discussion and illustrations, those skilled in the art will readily recognize that various modifications and changes may be made without strictly following the exemplary embodiments and applications illustrated and described herein. Furthermore, various features of the different embodiments may be implemented in various combinations. Such modifications do not depart from the true spirit and scope of the present disclosure, including those set forth in the following claims.

What is claimed is:

1. A method comprising:
   connecting a silicon wafer to a sawing foil;
   dicing the silicon wafer and producing therefrom a plurality of self-contained chip-scale device packages in which each device package is separated from other ones of the device packages by a gap defined by sidewalls of the device packages, is connected to the sawing foil, and has an active side and a non-active side between which the sidewalls extend; and
   while the device packages are coupled to a common foil, concurrently depositing an electrically isolating coating on the sidewalls and at least a portion of the non-active side of all of the plurality of device packages.

2. The method of claim 1, wherein dicing the silicon wafer and producing therefrom a plurality of self-contained chip-scale device packages includes forming chip-scale device packages of different sizes and geometries.

3. The method of claim 1, wherein
   dicing the silicon wafer includes using a plasma to remove portions of the silicon wafer to form the gaps, and
   depositing an electrically isolating coating on the sidewalls and the non-active sides includes depositing the coating from a plasma.

4. The method of claim 1, wherein
   dicing the silicon wafer includes using a plasma to remove portions of the silicon wafer to form the gaps, and
   depositing an electrically isolating coating on the sidewalls and the non-active sides includes depositing the coating from the same plasma used to remove portions of the silicon wafer.

5. The method of claim 1,
   further including providing an etch mask and etching a portion of the non-active side of the device packages under the mask, and
   wherein depositing an electrically isolating coating includes depositing the electrically isolating coating on the sidewalls and the etched portion of the non-active side of the device packages.

6. The method of claim 5, further including removing the etch mask after dicing the silicon wafer and prior to depositing an electrically isolating coating on a portion of the sidewalls of the device packages.

7. The method of claim 1, wherein depositing an electrically isolating coating includes depositing the coating on the entire non-active side of the device packages.

8. The method of claim 1, wherein
dicing the silicon wafer includes producing device packages being separated from other device packages by a distance less than 20 μm, and
depositing an electrically isolating coating includes depositing the coating at a thickness less than 1 μm.

9. The method of claim 1, further including
forming pads on the active side at a first pitch,
connecting the device packages via the pads to PCB connectors having a second pitch different than first pitch; and
using the electrically isolating coating to mitigate current leakage between one of the PCB connectors and at least one of the sidewalls.

10. The method of claim 1, wherein depositing an electrically isolating coating on the sidewalls and at least a portion of the non-active side includes depositing the electrically isolating coating using a plasma.

11. The method of claim 1, wherein dicing the silicon wafer includes using a plasma to form a plurality of self-contained chip-scale device packages with non-rectangular edges.

12. A method comprising:
providing a wafer having an active side and a non-active side, the active side including a plurality of independently-operable integrated circuits each being separated from one another by separation regions within the wafer;
connecting the wafer to a sawing foil;
dicing the wafer at the separation regions and producing therefrom a plurality of self-contained chip-scale device packages having sidewalls defined by the dicing and remaining connected to the sawing foil, each device package including one of the plurality of integrated circuits and each device package being separated from other ones of the device packages by a gap defined by the sidewalls;
depositing an electrically isolating coating on the sidewalls and the non-active side of each of the plurality of device packages; and
after depositing the electrically isolating coating, separating the sawing foil from the device packages and attaching each of the device packages to a printed circuit board (PCB) via a solder bump.

13. The method of claim 12, wherein providing a plurality of independently-operable integrated circuits includes providing independently-operable integrated circuits of different sizes and geometries, and producing a plurality of self-contained chip-scale device packages includes producing self-contained chip-scale device packages of different sizes and geometries.

14. The method of claim 12, wherein the wafer is silicon and dicing the silicon wafer includes using a plasma to remove portions of the silicon wafer to form the gaps, and depositing an electrically isolating coating on the sidewalls and the non-active sides includes depositing the coating from the same plasma used to removed portions of the silicon wafer.

15. The method of claim 12, wherein the wafer is silicon and dicing the silicon wafer includes using a plasma to remove portions of the silicon wafer to form the gaps and produce the self-contained chip-scale device packages having non-rectangular edges.

16. The method of claim 12, wherein
dicing the wafer includes dicing the wafer with a plasma to form the devices with the gaps defined by sidewalls of adjacent self-contained chip-scale device packages being less than about 20 μm, and
depositing an electrically isolating coating includes depositing the coating using a plasma at thickness between approximately 0.1 μm and 1.0 μm.

17. The method of claim 12, further including
forming pads on the PCB at a first pitch,
connecting the device packages to PCB connectors having a second pitch different than first pitch and
using the electrically isolating coating to mitigate current leakage between one of the PCB connectors and at least one of the sidewalls.

18. The method of claim 12, wherein dicing the wafer at the separation regions and producing therefrom a plurality of self-contained chip-scale device packages includes producing the self-contained chip-scale device packages having sidewalls that extend at between the active side and the non-active side at an acute angle relative to a surface of one of the active and non-active sides.

19. An apparatus comprising:
a printed circuit board (PCB) having a first conductive contact at a surface of the PCB; and
a chip-scale device package connected to the PCB, the package including
a silicon wafer with an active side having an integrated circuit, a non-active side having bulk silicon, sidewalls extending between the active side and the non-active side, and a second conductive contact at a surface of the active side and connected to the first conductive contact, the second conductive contact being configured and arranged to electrically connect the integrated circuit to the PCB via the first conductive contact, with at least one of the sidewalls extending at an acute angle relative to a surface of one of the active and non-active sides and at least one edge between a sidewall and at least one of the active and non-active sides being non-rectangular, and
an electrically isolating plasma coating extending continuously along and in contact with one of sidewalls and the non-active side, the plasma coating being configured and arranged to mitigate current leakage between the sidewalls and the first conductive contact.

* * * * *